United States Patent [19]

Komano

[11] Patent Number: 4,847,178

[45] Date of Patent: Jul. 11, 1989

[54] POSITIVE PHOTOSENSITIVE O-QUINONE DIAZIDE COMPOSITION WITH BENZOTRIAZOLE CARBOXYLIC ACID OR ALKYL ESTER

[75] Inventor: Hiroshi Komano, Samukawa, Japan

[73] Assignee: Tokyo Ohka Kogyo Co., Ltd., Japan

[21] Appl. No.: 41,671

[22] Filed: Apr. 30, 1987

[30] Foreign Application Priority Data

May 8, 1986 [JP] Japan .................................. 61-103745

[51] Int. Cl.$^4$ ................................................. G03C 1/60
[52] U.S. Cl. ..................................... 430/191; 430/165; 430/190; 430/192; 430/193
[58] Field of Search ............... 430/191, 190, 192, 193, 430/165

[56] References Cited

U.S. PATENT DOCUMENTS

| | | | |
|---|---|---|---|
| 3,661,582 | 5/1972 | Broyde | 430/191 |
| 3,859,099 | 1/1975 | Petropoulos et al. | 430/191 |
| 4,036,644 | 7/1977 | Kaplan et al. | 430/191 |
| 4,365,019 | 12/1982 | Daly et al. | 430/191 |
| 4,438,190 | 3/1984 | Ishimara et al. | 430/281 |

OTHER PUBLICATIONS

Hamel, C. J., *IBM Technical Disclosure Bulletin*, vol. 18, No. 6, 11/1975, p. 1775.

*Primary Examiner*—Charles L. Bowers, Jr.
*Attorney, Agent, or Firm*—Lowe, Price, LeBlanc, Becker & Shur

[57] ABSTRACT

A positive type photosensitive composition capable of improving the drawback in the conventional positive type photosensitive resin composition, improving adhesion between the positive type photoresist and the substrate and improving developability is provided by incorporating benzotriazole carboxylic acids in the positive type photoresist.

8 Claims, No Drawings

POSITIVE PHOTOSENSITIVE O-QUINONE DIAZIDE COMPOSITION WITH BENZOTRIAZOLE CARBOXYLIC ACID OR ALKYL ESTER

BACKGROUND OF THE INVENTION

1. Field of the Invention

This invention concerns a photosensitive type resin composition and, more specifically, it relates to a positive type photosensitive resin composition having improved adhesion to a substrate and developing properties.

2. Description of Prior Arts

In the production of semiconductors, printed circuit boards, printing plates, etc., etching, plating, diffusion or other similar treatments have generally been applied. When applying such treatments, it is generally necessary to protect a portion of the substrate. As a means for selectively protecting the surface of the substrate, the standard practice has been, for instance, to coat the substrate with a photosensitive resin (hereinafter simply referred to as a "photoresist"), irradiate with actinic rays projected through a predetermined original film and then apply a developing treatment to form a resist pattern on the substrate. Then, various treatments such as etching, plating and diffusion as described above have generally been applied using the thus obtained resist pattern as a mask.

Known photoresists include a negative type in which a resist pattern is formed by dissolving and removing a non-irradiated portion with a liquid developer, utilizing the property that the irradiated portion hardens into an insoluble state, and a positive type in which a resist pattern is formed, conversely, by dissolving and removing an irradiated portion. The positive type photoresist is noted for its capacity to perform in a smaller scale which is the trend in the fabrication size. It has greater resolution power, yields sharper images than the negative type photoresist, is free from the effects of oxygen upon irradiation of actinic rays, and has excellent stability after coating. However, for coping with the size-reducing trend in fabrication, close bondability to the substrate is extremely important in addition to the resolution power of the positive type photoresist and it is necessary that the resist pattern be firmly bonded to the substrate with no ready separation during treatments such as developing or etching. In view of the above, conventional positive type photoresists are not sufficient and can not cope with the size-reducing trend in the fabrication.

For improving the adhesive property of the positive type photoresist to the substrate, a positive type photoresist has already been developed; incorporated with a compound obtained by reacting an addition product of a conjugated diene polymer with α,β-unsaturated dicarboxylic acid or the anhydride thereof and a compound having an alcoholic hydroxy group thereby conducting partial esterification (refer, for example, to Japanese Patent Kokai No. Sho 59-170836), as well as a positive type photoresist incorporated with a compound obtained from an unsaturated dicarboxylic acid and ethylene glycol through polycondensating reaction (refer, for example, to Japanese Patent Kokai No. Sho 58-172643), etc.

However, even these known techniques do not always provide a sufficient adhesive property to the substrate for coping with the size-reducing trend in fabrication at present and, if the polymer type compound is added for the improvement of the adhesive property, there is an additional problem. The developing property of the positive type photoresist is worsened and the portion irradiated with the actinic rays can not be completely removed by the liquid developer upon developing treatment thereby resulting in residual resist.

Further, for improving the adhesiveness of a negative type photoresist to a substrate, a negative type photoresist has also been developed containing a compound selected from the group consisting of benzotriazole, benzoimidazole, benzothiazole, derivatives and salts thereof, and a phosphoric acid compound having a photopolymerizable unsaturated bonds (refer, for example, to Japanese Patent Kokai No. Sho 58-24035 and U.S. Patent Specification No. 4438190).

However, although the adhesion between the negative type photoresist and the substrate can be improved to some extent due to the property of the added compound benzotriazole of intensely bonding to the substrate in the prior art, there is still at present a drawback; the portion irradiated by the actinic rays can not completely be removed upon developing treatment resulting in a great amount of residual resist (that is, remarkably poor developing property).

SUMMARY OF THE INVENTION

It is one object of this invention to overcome the drawbacks in the conventional positive type photosensitive resin compositions and provide a positive type photosensitive resin composition with improved adhesion to the substrate and improved developing properties.

These and other objects of this invention will be understood by those skilled in the art in reference to the description made hereinafter.

The foregoing object of this invention can be attained by providing a positive type photoresist comprising a benzotriazole carboxylic acid or aliphatic ester represented by the general formula:

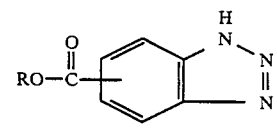

where R represents a hydrogen atom or an aliphatic hydrocarbon group having 1 to 3 carbon atoms.

EMBODIMENT OF THE INVENTION

The positive type photoresist used in this invention contains a photosensitive material comprising an o-quinonediazide compound as an essential ingredient. Specifically, the photosensitive material is a compound having an o-quinonediazide group in the molecule in which the o-quinonediazide group is decomposed under the irradiation of actinic rays at a wavelength of 300 to 500 nm to form an indene carboxylic acid and thus becomes alkali-soluble.

The photosensitive material usable herein can include, for example, o-naphthoquinone diazide sulfonic acid ester and o-naphthoquinone diazide sulfonic acid amide. Among them, those containing the o-naphthoquinone diazido sulfonic acid ester as the main ingredient are preferred. The o-naphthoquinone diazide sulfonic acid ester is an esterifying product of a compound having phenolic hydroxy groups and o-naphthoquinone diazide sulfonic acid, which can be obtained easily using a standard procedure.

The compound having phenolic hydroxy group can include, in addition to a novolak resin, alkyl gallate, homopolymer of p-hydroxystyrene, polyhydroxyphenyl which is a condensation product of pyrogallol and acetone, polyhydroxy benzophenone such as tetrahydroxy benzophenone, trihydroxybenzene, monoethers of trihydroxybenzene 2,2',4,4'-tetrahydroxydiphenylmethane, 4,4'-dihydroxydiphenylpropane, 4,4'-dihydroxydiphenylsulfone, 2,2'-dihydroxydinaphthylmethane, 2-hydroxyfluorene, 2-hydroxyphenanthrene, polyhydroxyanthraquinone purpurogalline and derivatives thereof and phenyl ester of 2,4,6-trihydroxy benzoic acid.

A film-forming substance, soluble in or swellable with an aqueous alkaline solution and various kinds of additives, may be added as required to the positive type photoresist. The film-forming substance can include, for example, novolak resin, polyvinyl alcohol, polyvinyl alkyl ether, a copolymer of styrene and acrylic acid, polyhydroxystyrene, polyvinyl hydroxy benzoate and polyvinyl hydroxy benzal. The film-forming substance that can be dissolved in or swellable with an aqueous alkali solution may be added alone or in admixtures of two or more thereof.

Further, various kinds of additives may be added. The various kinds of additives can include, for example, oleophilic phenol formaldehyde resins for improving the oil-receptibility, surface active agents for improving the coatability, dyes for coloring images, o-naphthoquinonediazide-4-sulfonyl chloride or photochromic compounds, etc as material for providing print-out property and plasticizers for improving the flexibility of the coated films. The dye usable herein can include oil blue, crystal violet, etc. The plasticizer usable herein can include, for example, phthalic acid esters, phosphoric acid ester, acrylic resin, epoxy resin, urethane resin and polyvinyl ether.

The benzotriazole carboxylic acid compound for use in this invention may be any of the compounds represented by the general formula:

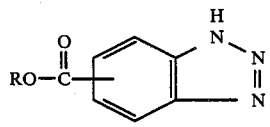

where R represents a hydrogen or an aliphatic hydrocarbon group having 1 to 3 carbon atoms.

The benzotriazole carboxylic acid compound represented by the general formula can include, for example, 4-benzotriazole carboxylic acid, 5-benzotriazole carboxylic acid and lower alkyl ester of benzotriazole carboxylic acid such as, for example, methyl, ethyl and propyl groups thereof.

The preferred benzotriazole carboxylic acid compound is a mixture of 4-benzotriazole carboxylic acid and 5-benzotriazole carboxylic acid, which is commercially available from The Sherwin-Williams Company under the trade name: "Carboxybenzo triazole". While this product can be used as it is, any of the benzotriazole carboxylic acid compounds represented by the above-mentioned general formula can be used with no particular restriction.

The amount of the benzotriazole carboxylic acid blended to the positive type photoresist is, preferably, from 0.05 to 5 % by weight based on the weight of the solid content of the photoresist. If the blending amount of the benzotriazole carboxylic acid exceeds the upper limit of the range, control for the temperature and the time in the developing treatment becomes difficult and the allowable range for the developing conditions is narrowed. If the blending amount of the benzotriazole carboxylic acid compound is lower than the lower limit of the range, adhesive property with the substrate becomes insufficient. The preferred amount of the benzotriazole carboxylic acid compound blended to the positive type photoresist is in fact between 0.2 to 2 % by weight.

(Mode of Use)

The photosensitive resin composition formed by this invention should be prepared by dissolving the positive type photoresist and the compound represented by the general formula described above in an adequate solvent and applying the thus obtained solution to the substrate in the form of a thin film.

Examples of the solvent can include, for example, ketones, polyhydric alcohols, derivatives of polyhydric alcohols, cyclic ethers and esters.

Ketones usable herein can include, for example, acetone, methyl ethyl ketone, cyclohexanone and isoamylketone. Ethylene glycol can be used as the polyhydric alcohols. Derivatives of polyhydric alcohols usable herein can include, for example, ethylene glycol monomethyl ether, ethylene glycol monoethyl ether, ethylene glycol monobutyl ether, ethylene glycol monomethyl ether acetate, ethylene glycol monoethyl ether acetate, ethylene glycol monobutyl ether acetate, ethylene glycol monoacetate, monomethyl ether of diethylene glycol, monoacetate monomethyl ether of diethylene glycol, monoethyl ether of diethylene glycol, monopropyl ether of diethylene glycol, monobutyl ether of diethylene glycol and monophenyl ether of diethylene glycol.

Dioxane and tetrahydrofuran can be used as the cyclic ethers and methyl acetate, ethyl acetate, butyl acetate, etc. can be used as esters.

One solvent alone or a blend of two or more solvents may be used.

(Substrate)

The substrate on which the coating composition of this invention is coated can include, for example, metal substrates of iron, aluminum, zinc, nickel-iron alloy, copper and stainless steels, plastic sheets such as polyesters, polyimides and cellulose tri-esters, and silicon wafers for use in the production of semiconductor devices. Since the composition according to this invention has a particularly high adhesive property to metal substrates, it is extremely effective for coating to copper-clad boards used for the production of printed circuit boards.

(Method of Use)

The composition according to this invention is coated on the substrate using a roll coater, dip coater, spinner, or the like, followed by drying. The coated film, after drying is selectively irradiated with actinic rays using a predetermined original film. As the optical source for the actinic rays, one can use a low pressure mercury lamp, high pressure mercury lamp, super high pressure mercury lamp, arc lamp, xenone lamp, etc.

The irradiated coating films described above are developed by dissolving to remove the portion irradiated under actinic rays with an aqueous alkaline solution. The thus formed resist pattern adheres extremely firmly onto the substrate.

The alkaline agent for preparing the aqueous alkaline solution usable herein can include, for example, inorganic alkaline compounds such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium carbonate, potassium carbonate, and sodium hydrogen carbonate, as well as organic alkaline compounds such as monoethanol amine, diethanol amine, triethanol amine and tetramethyl ammonium hydroxide.

Effect of the Invention

The resist pattern prepared using the positive type photosensitive resin composition described here has extremely high adhesion to the substrate and is stable with little aging change and, accordingly, has the advantageous effect of causing less raising or defoliation of the resist pattern from the substrate or creeping of plated matter in the etching, plating or other similar treatments applied to the substrate in the succeeding step. Further, since the resist prepared using this invention's positive type photosensitive resin composition has a high developability and the actinic ray-irradiated portions can completely be dissolved by an aqueous alkaline solution, fabrication at high quality and high accuracy can be applied to the substrate.

EXAMPLES

The following examples are provided as illustrations but it is to be understood that they are namely for explanation and in no way restrict the invention.

EXAMPLE 1

A coating solution of a positive type photosensitive resin composition was prepared by dissolving 30 parts by weight of a condensate of m-cresol novolak resin: PR-51136A (product manufactured by Sumitomo Durez Co.) and o-naphthoquinone-1,2-diazide-5-sulfonic chloride, 50 parts by weight of a phenol novolak resin: PR-1050 (product manufactured by Sumitomo Durez Co.), 20 parts by weight of a copolymerized resin of methylmethacrylate - methacrylic acid, 0.75 parts by weight of oil blue-#603 (oil dye manufactured by Orient Chemical Industry Company) and one part by weight of "carboxybenzo triazole" (manufactured by The Sherwin-Williams Company) into a mixed solution comprising 350 parts by weight of ethylene glycol monoethyl ether acetate and 50 parts by weight of diethylen glycol monomethyl ethers, and then filtered.

Then, the coating solution was coated on a copper-clad board having a physically ground surface to a dry film thickness of 5 μm, by means of a roll coater, and dried. Actinic rays were irradiated to the thus obtained dried coating film through a positive film using a 3 kW super high pressure mercury lamp. Then, the copper-clad board having the irradiated coating film was developed using an aqueous solution of 1.5 wt % potassium hydroxide at 25° C. for 60 seconds, washed thoroughly with water, and then dried. Then, the copper exposed by the development was selectively etched and removed by spraying a ferric chloride solution at 30 Be degree for 90 seconds to the thus exposed copper, obtaining a printed circuit board. Upon observing the thus obtained circuit portion, a pattern with 50 μm size was reproduced.

As a comparison, a similar experiment was conducted using the same positive type photosensitive resin composition without blending in "carboxybenzo triazole" and, as a result, only a resist pattern of 70 μm size could be obtained.

In this way, the invention's improvement in the adhesive property of the product to the copper-clad board could be confirmed.

EXAMPLE 2

A coating solution of a positive type photosensitive resin composition was prepared by dissolving 20 parts by weight of a condensate of one mol of isoamyl pyrogallate and 2 mol of o-naphthoquinone-1,2-diazide-5-sulfonic chloride, 50 parts by weight of the phenol novolak resin PR-1050 (manufactured by Sumitomo Durez Company), 10 parts by weight of Cashew-modified novolak resin 17BB (manufactured by Cashew Company), 20 parts by weight of polyvinyl methyl ether Lutonal M-40 (manufactured by BASF AG) and 1.5 parts by weight of "carboxybenzo triazole" (manufactured by The Sherwin-Williams Company) into 150 parts by weight of ethylene glycol monoethyl ether acetate, 100 parts by weight of methyl ethyl ketone and 50 parts by weight of ethylene glycol monoethyl ether, and then filtered.

Then, the coating solution prepared as above was coated, using a dip coater on a commercially available nickel-iron alloy material of 0.15 mm thickness, degreased and cleaned with an alkaline degreasing agent and diluted sulfuric acid to a dry thickness of 10 μm, and then dried. The thus obtained specimen was irradiated by actinic rays by a 3 kW super high pressure mercury lamp through a positive film. Then, stable images could be obtained by immersing the thus irradiated specimen into an aqueous sodium hydroxide solution at 1 wt % concentration for 90 seconds.

Upon observing the residual resist after development, a space pattern of 20 μm width was analyzed and no development residue of the resist was found on the space.

As a control, a similar experiment was conducted using the same photosensitive resin composition as described above without blending in "carboxybenzo triazole" (manufactured by The Sherwin-Williams Company).

The development of a resist residue was confirmed in a space pattern of less than 40 μm width.

The high developing property of a composition created using this invention was thus confirmed by these tests.

EXAMPLE 3

A coating solution of a positive type photosensitive resin composition was prepared by dissolving 25 parts of a condensate of one mol of 2,3,4-trihydroxybenzophenone and 2 mol of o-naphthoquinone-1,2-diazide-5-sulfonic chloride, 75 parts by weight of phenol novolak resin, PS F-2805 (manufactured by Gun-ei Chemical Co.) and 0.5 parts by weight of ethyl benzotriazole carboxylate into a mixed solution comprising 350 parts by weight of ethylene glycol monoethyl ether acetate and 50 parts by weight of ethylene glycol monomethyl ether and then filtered.

Then, the coating solution prepared above was coated using a spinner on a substrate comprises of an indium oxide film of 400 Å thickness on a glass plate to a 1.5 μm dry film thickness and then dried. The thus obtained specimen was irradiated with actinic rays by a 3 kW super high pressure mercury lamp through a positive film. Then, the specimen after the irradiation was developed with an aqueous tetramethyl ammonium hydroxide solution at 2.5 wt % concentration at 25° C. for 30 seconds. After sufficient washing with water, the exposed indium oxide film was spray-etched with a mixed solution comprising 2 parts by weight of hydrochloric acid at 35 wt % concentration, one part of nitric acid at 60 wt % concentration and 2 parts by weight of water at 40° C. for 30 seconds. Etched images exactly corresponding to the original image could be obtained with no undercuts even on a 5 μm width pattern.

EXAMPLE 4

A coating solution of a positive type photosensitive resin composition was prepared by dissolving 40 parts by weight of a condensate of polyhydroxyphenyl as a polycondensate of pyrogallol and acetone, o-nathoquinone-1,2-diazide-5-sulfonic acid chloride, 57.5 parts by weight of cresol novolak resin PR-1767 (manufactured by Sumitomo Durez Co.), 2.5 parts by weight of p-tert-butylphenol novolak resin CKM2400 (manufactured by Showa Union Company), 2 parts by weight of o-naphthoquinone-1,2-diazide-4-sulfonic acid chloride, 0.75 parts by weight of crystal violet powder (dye manufactured by Hodogaya Chemical Co.) and 2.5 parts by weight of "carboxybenzo triazole" (manufactured by The Sherwin-Williams Company) into 400 parts by weight of ethylene glycol monomethyl ether and filtered.

Then, the coating solution prepared above was coated, using a whirler on an aluminum plate of 0.24 mm thickness applied with graining and anodization film with phosphoric acid, such that the drying weight was 2.5 g/m$^2$, and dried to obtain a presensitized plate print. After irradiating the presensitized plate with actinic rays using a 3 kW super high pressure mercury lamp through a positive film, the irradiated presensitized plate was developed with an aqueous sodium metasilicate at 3 wt % concentration for 45 seconds and then washed with water, obtaining a favorable offset printing plate with no residual resist in the actinic ray irradiated portions. When conducting printing by using the offset printing plate, it showed 200,000 sheets of printing resistance and the ink depositability was favorable to the last sheet.

As a comparison, a presensitized plate was prepared in a similar manner using the same positive type photosensitive composition described above except for not blending in "carboxybenzo triazole" (manufactured by The Sherwin-Williams Company). The ink depositability worsened for the printed matters after the 100,000th print and printing became impossible after 120,000 sheets.

Upon examining the presensitized plate prints obtained in the foregoing experiment for storage stability and aging changes, no degradation was found in either the developing rate or the sensitivity after 6 months (for those obtained from the photosensitive resin composition blended with "carboxybenzo triazole" according to the invented formula). On the other hand, reduction in the sensitivity and the residual resist were found in those obtained from the photosensitive resin composition not blended with "carboxybenzo triazole". These experiments confirmed that positive type photosensitive resin compositions formed using this invention also store very well.

EXAMPLE 5

A printed circuit board was prepared using procedures as in Example 1, except for using 4-benzo-triazole carboxylic acid instead of "carboxybenzo triazole". As a result, a pattern of 50 μm size was reproduced in the same manner as in Example 1.

EXAMPLE 6

A resist pattern was formed on a nickel-iron alloy material using the same procedures as in Example 2, except for using 4-benzo-triazole carboxylic acid instead of "carboxybenzo triazole". As a result, a space pattern of 20 μm width was analyzed in the same manner as in Example 2 and no residual resist after development was observed on the space.

COMPARATIVE EXAMPLE 1

When a similar experiment was conducted using the same procedures as Example 1, except for using benzotriazole instead of "carboxybenzo triazole" used in Example 1, a great amount of residual resist was observed in the space pattern.

COMPARATIVE EXAMPLE 2

When a similar experiment was conducted in the same manner as Example 2, except for using benzotriazole instead of "carboxybenzo triazole" used in Example 2, a great amount of residual resist was observed in the space pattern.

What is claimed is:

1. A positive type photosensitive resin composition, comprising
   a material comprising a photosensitive amount of an o-quinone diazide group-containing compound wherein the o-quinone diazide group decomposes when subjected to irradiation with actinic rays; and
   about 0.05 to 5 wt % with respect to the total solid content of the composition of a benzotriazole carboxylic acid or aliphatic ester compound of the formula

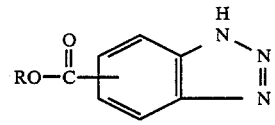

wherein
   R is H or a ($C_1$–$C_3$) aliphatic hydrocarbon residue.
2. The resin composition of claim 1, wherein
   the benzotriazole carboxylic acid compound is present in an amount of about 0.2 to 2 wt % with respect to the total solid content of the composition.
3. The resin composition of claim 1, wherein
   the benzotriazole carboxylic acid compound is selected from the group consisting of 4-benzotriazole carboxylic acid and 5-benzotriazole carboxylic acid.
4. The resin composition of claim 1, wherein
   the benzotriazole carboxylic acid compound is an ester of a benzotriazole carboxylic acid.
5. The resin composition of claim 4, wherein the ester of the benzotriazole carboxylic acid is a (C$_1$–C$_3$) alkyl ester of benzotriazole carboxylic acid.

6. The resin composition of claim 1, wherein the o-quinone diazide group-containing compound is selected from the group consisting of o-naphthoquinonediazide sulfonic acid ester and o-naphthoquinonediazide sulfonic acid amide.

7. The resin composition of claim 6, wherein the o-naphthoquinonediazide sulfonic acid ester is the esterification product of a compound having at least one phenolic hydroxyl group and o-naphthoquinonediazide sulfonic acid.

8. The resin composition of claim 7, wherein the compound having a phenolic hydroxyl group is selected from the group consisting of Novolak resin, alkyl esters of gallic acid, homopolymers of p-hydroxystyrene, condensates of pyrogallol and acetone, tetrahydroxybenzophenone, trihydroxybenzene, monoethers of trihydroxybenzene, 2,2',4,4'-tetrahydroxydiphenylmethane, 4,4'-dihydroxydiphenylpropane, 2,2'-dihydroxydinaphthylmethane, 4,4'-dihydroxydiphenyl sulfonfic acid, 2-hydroxyfluorene, 2-hydroxyphenanthrene, polyhydroxyanthraquinone, purpurogalline, purpurogallines and phenyl esters of 2,4,6-trihydroxybnezoic acid.

* * * * *